United States Patent [19]

Gersdorf et al.

[11] Patent Number: 5,204,222

[45] Date of Patent: * Apr. 20, 1993

[54] PHOTOCURABLE ELASTOMERIC MIXTURE AND RECORDING MATERIAL, OBTAINED THEREFROM, FOR THE PRODUCTION OF RELIEF PRINTING PLATES

[75] Inventors: Joachim Gersdorf, Wiesbaden; Matthias Kroggel, Liederbach; Karl-Josef Rauterkus, Kelkheim, all of Fed. Rep. of Germany

[73] Assignee: Hoechst Aktiengesellschaft, Frankfurt am Main, Fed. Rep. of Germany

[*] Notice: The portion of the term of this patent subsequent to Jul. 23, 2008 has been disclaimed.

[21] Appl. No.: 742,732

[22] Filed: Aug. 6, 1991

Related U.S. Application Data

[63] Continuation of Ser. No. 379,946, Jul. 14, 1989, abandoned.

[30] Foreign Application Priority Data

Jul. 16, 1988 [DE] Fed. Rep. of Germany ....... 3824146

[51] Int. Cl.⁵ .............................................. G03F 7/038
[52] U.S. Cl. .................................... 430/281; 430/284; 430/288; 430/906; 522/149
[58] Field of Search ............... 435/281, 283, 284, 288, 435/906; 522/149

[56] References Cited

U.S. PATENT DOCUMENTS

| | | | |
|---|---|---|---|
| 3,630,746 | 12/1971 | Takimoto et al. | 96/115 |
| 3,936,254 | 2/1976 | Sawada et al. | 425/89 |
| 3,948,665 | 4/1976 | Richter et al. | 430/284 |
| 3,960,572 | 6/1976 | Ibata et al. | 430/281 |
| 4,042,386 | 8/1977 | Okai et al. | 96/35.1 |
| 4,110,184 | 8/1978 | Dart et al. | 430/284 |
| 4,224,399 | 9/1980 | Merrill et al. | 522/149 |
| 4,289,838 | 9/1981 | Rowe et al. | 430/163 |
| 4,323,636 | 4/1982 | Chen et al. | 430/271 |
| 4,323,637 | 4/1982 | Chen et al. | 430/271 |
| 4,369,246 | 1/1983 | Chen et al. | 430/306 |
| 4,423,135 | 12/1983 | Chen et al. | 430/271 |
| 4,493,807 | 1/1985 | Vyvial et al. | 264/101 |
| 4,590,144 | 5/1986 | Schornick et al. | 430/284 |
| 4,828,963 | 5/1989 | Fujikawa | 430/288 |
| 4,849,307 | 7/1989 | Hoffmann et al. | 430/281 |
| 5,034,306 | 7/1991 | Gersdorf et al. | 430/281 |

FOREIGN PATENT DOCUMENTS

| | | |
|---|---|---|
| 65535/86 | 5/1987 | Australia . |
| 3541162 | 5/1987 | Fed. Rep. of Germany . |
| 62-246047 | 10/1987 | Japan . |
| 1454191 | 10/1976 | United Kingdom . |

OTHER PUBLICATIONS

Polymer Handbook III Ed., Wiley Interscience.
Journal of Polymer Science, vol. XLIII, pp. 509-516 (1960) "Chain transfer Constants of Polyethylene Glycol and Its, etc. . . . ".

*Primary Examiner*—Marion E. McCamish
*Assistant Examiner*—Christopher D. RoDee
*Attorney, Agent, or Firm*—Foley & Lardner

[57] ABSTRACT

A photocurable elastomeric mixture is described which comprises a compound which contains at least one terminal ethylenically unsaturated group and is polymerizable by free radical polymerization, a photopolymerization initiator and, as binder, a graft polymer which is soluble or dispersible in water or an aqueous solution, the graft base of which is a polymer of diol components and diisocyanate components having at least 2 urethane groups in the molecule, onto which polymer carboxylic acid vinyl ester units having 3 to 20 carbon atoms, or their saponification products, are grafted. The mixture is suitable for the production of relief printing plates, in particular flexographic printing plates, and can be developed with water or aqueous solutions.

14 Claims, No Drawings

PHOTOCURABLE ELASTOMERIC MIXTURE AND RECORDING MATERIAL, OBTAINED THEREFROM, FOR THE PRODUCTION OF RELIEF PRINTING PLATES

This application is a continuation of application Ser. No. 07/379,946, filed Jul. 14, 1989 now abandoned.

BACKGROUND OF THE INVENTION

The invention relates to a photocurable, negative-working mixture and a recording material, obtained therefrom, which is suitable for the production of elastic relief printing plates.

Mixtures of the said generic type are known and usually contain an elastomeric binder, a compound which can be polymerized by free radical polymerization and a polymerization initiator which can be activated by actinic radiation. After exposure, mixtures of this type, which, for example, are described in DE-C 2,215,090, can be developed only with organic solvents to give a relief image.

JP-A-246047/87 describes a system which can be developed in an aqueous medium. This system is based on partially saponified polyvinyl acetate and contains a polyether polyurethane having mercapto groups as a graft base. Since systems with vinyl acetate which contain mercapto groups have very high chain transfer constants, grafting in such systems takes place expressly on the mercapto groups.

It is true that in U.S. Pat. No. 4,042,386 and DE-B 1,902,639, 1,917,917 and 2,402,808 photosensitive recording materials which are based on partially saponified polyvinyl acetate and can be developed in an aqueous medium are described for the production of relief printing plates, but an addition of water is needed for homogenization and layer formation, which makes a subsequent drying process necessary. Furthermore, these relief printing forms do not have the high elasticity and low Shore A hardness necessary for flexographic printing.

In DE-A 3,541,162 and EP-B 0,080,664 internally plasticized, partially saponified polyvinyl acetates are described as binders for photosensitive recording materials. These graft polymers, which are obtained by polymerization of vinyl esters in the presence of polyalkylene oxides and subsequent partial saponification, are indeed more elastic than pure partially saponified polyvinyl acetates, but the addition of water is likewise necessary when processing the corresponding photopolymer mixtures into sheet-like recording materials.

SUMMARY OF THE INVENTION

Accordingly, it is an object of the present invention to provide a photosensitive elastomeric mixture which can be developed in water or aqueous solutions and which can be shaped, without the addition of water, by thermoplastic processing into a photosensitive relief printing plate.

In accomplishing the foregoing objective, there has been provided, in accordance with one aspect of the present invention, a photocurable elastomeric mixture comprising (a) an elastomeric graft polymer binder, said graft polymer comprising (i) a graft base, comprising a plurality of diol and diisocyanate units, having at least 2 urethane groups, and (ii) a plurality of carboxylic acid vinyl ester units having 3 to 20 carbon atoms, or saponification products thereof, grafted to the graft base, the graft polymer being soluble or dispersible in water or aqueous solution, (b) a compound comprising at least one terminal ethylenically unsaturated group and having a boiling point at normal pressure of above 100° C., which is polymerizable by free radical polymerization, and (c) a compound or combination of compounds capable of initiating polymerization of compound (b) under the action of actinic radiation.

In accordance with another aspect of the present invention there is provided a photocurable recording material comprising a support and a photocurable layer comprising the above-described mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

The proportion of the grafted-on components is in general about 10 to 99% by weight, preferably 30 to 90% by weight and in particular 40 to 80% by weight, based on the total graft polymer.

The graft bases comprise polyurethanes having at least two urethane groups in the molecule, the number of urethane groups per molecule being subject to no particular upper limit and in general having values higher than 2.

The polyurethanes employed as graft base can be produced from diols and diisocyanates by conventional processes of polyurethane synthesis and are preferably synthesized at temperatures between about 60° and 120° C., preferably between 70° and 100° C., using catalysts, for example tertiary amines or organic tin compounds.

In principle, all of the diols customarily used in polyurethane synthesis can be employed. Cycloaliphatic diols, such as cyclohexanediols, and also aliphatic diols, in particular those having 2 to 12 carbon atoms, are preferred. Polyetherdiols, for example polypropylene oxides, polybutylene oxides and copolymers of ethylene oxide, propylene oxide and butylene oxide, in particular the block copolymers thereof, are also preferred; polyethylene oxides are particularly preferred. Polyetherdiols, in particular polyethylene glycols, with molecular weights of between 200 and 10,000 are preferably used, polyethylene glycols with molecular weights of between about 400 and 1,500 being particularly preferred. The polyetherdiols are optionally employed in combination with low molecular weight aliphatic diols, for example 1,4-butanediol, 1,3-propanediol, ethylene glycol or diethylene glycol. The molar ratio of polyetherdiol to low-molecular aliphatic diol is preferably from about 1:0.1 to 1:0.7.

Diisocyanate components which can be employed are aromatic diisocyanates, for example m- and p-xylylene diisocyanate, tolylene 2,4-diisocyanate, tolylene 2,6-diisocyanate or mixtures of the latter two isomers, naphthylene 1,5-diisocyanate, diphenylmethane 4,4'-diisocyanate, phenyl benzyl ether 4,4'-diisocyanate and the like.

Aliphatic and/or cycloaliphatic diisocyanates are preferred. Preferred aliphatic diisocyanates are those having 2 to 12 carbon atoms in the aliphatic radical, for example ethylene diisocyanate, propylene diisocyanate, tetramethylene diisocyanate and 2,2,4-trimethylhexamethylene diisocyanate.

Preferred cycloaliphatic diisocyanates are, for example, 1,4-diisocyanato-cyclohexane, dicyclohexylmethane 4,4'-diisocyanate and isophorone diisocyante. Hexamethylene diisocyanate and isophorone diisocyanate are particularly preferred.

The molar ratio of diol to diisocyanate component is preferably between about 1:0.99 and 1:0.5, in particular between 1:0.98 and 1:0.7. The average molecular weights of the polyurethanes are preferably between about 200 and 100,000, in particular between 1,300 and 50,000 and particularly preferentially between 3,000 and 25,000.

Carboxylic acid vinyl esters having 3 to 20 and preferably 4 to 14 carbon atoms are employed for grafting onto the polyurethane. Vinyl acetate and/or vinyl propionate, in particular vinyl acetate, are particularly preferred. Mixtures of vinyl acetate and/or vinyl propionate and vinyl versatate are also preferred. In particular in the case of partial or complete saponification of the products following the graft polymerization, the co-use of vinyl propionate in addition to vinyl acetate during grafting is advantageous. Moreover, copolymerizable mixtures of carboxylic acid vinyl esters can be grafted, preferably mixtures of vinyl acetate and vinyl versatate, the proportion of vinyl versatate being about 0.2 to 10% by weight, preferably 0.5 to 5% by weight, relative to the proportion of vinyl acetate. Grafting with different carboxylic acid vinyl esters in the form of block copolymers, optionally in combination with further ethylenically unsaturated and copolymerizable monomers, can also be advantageous. Furthermore, the carboxylic acid vinyl esters can also be grafted together with other ethylenically unsaturated and copolymerizable monomers, such as maleic acid, itaconic acid, mesaconic acid, crotonic acid, acrylic acid or the esters thereof.

The graft polymers obtained can be converted by hydrolysis, alcoholysis or transesterification into partially or completely saponified products, the degree of hydrolysis being at least mol %, preferably about 70 to 99 mol %, based on the mole number of saponifiable monomer units in the graft polymer. The production of graft polymers with a polyurethane graft base is described in German Patent Application 3,732,089, corresponding to U.S. patent application 247,694, the contents of which are hereby incorporated by reference.

The photosensitive mixtures according to the invention comprise in general about 20 to 95% and preferably 30 to 70% by weight of binder. They furthermore comprise at least one olefinically unsaturated compound polymerizable by free radical polymerization as well as at least one photoinitiator. Suitable monomers having one or more polymerizable olefinic double bonds are, in particular, esters and amides of acrylic acid and methacrylic acid. Examples are the compatible monoacrylates and diacrylates, monomethacrylates and dimethacrylates of monohydric or polyhydric alcohols such as ethylene glycol, di-, tri-, tetra- or polyethylene glycols, the latter preferably having 10 to 15 ethylene glycol units, 1,3-propanediol, glycerol, 1,1,1-trimethylolpropane, 1,2,4-butanetriol or pentaerythritol, for example ethylene glycol monomethacrylate, 1,3-propanediol monomethacrylate, glycerol monoacrylate and diacrylate, 1,2,4-butanetriol monomethacrylate, pentaerythritol triacrylate, polyethylene glycol methyl ether acrylate, tetradecaethylene glycol dimethacrylate or the triether of glycerol and 3 moles of N-methylol-acrylamide or N-methylolmethacrylamide. The amount of monomers is in general about 5 to 70%, preferably about 10 to 50% by weight of the non-volatile constituents of the mixture.

Photoinitiators which can be used for the mixtures according to the invention are the known compounds which display an adequate thermal stability during processing of the recording materials and also adequate free radical formation on exposure, with initiation of the polymerization of the monomers. They should absorb light in the wavelength range of about 250 to about 500 nm with the formation of free radicals. Examples of suitable photoinitiators are acyloins and their derivatives, such as benzoin, benzoin alkyl ethers, for example benzoin isopropyl ether, vicinal diketones and their derivatives, for example benzil, benzil acetals, such as benzil dimethylketal, fluorenones, thioxanthones, polynuclear quinones, acridines and quinoxalines; and also trichloromethyl-s-triazines, 2-halogenomethyl-4-styryl-1,3,4-oxadiazole derivatives, halogenooxazoles substituted by trichloromethyl groups, carbonylmethyleneheterocyclic compounds containing trihalogenomethyl groups in accordance with DE-A 3,333,450, acylphosphine oxide compounds, such as are described, for example, in DE-A 3,133,419 and other phosphorus-containing photoinitiators, for example the 6-acyl-(6H)-dibenz[c,e][1,2]-oxaphosphorine 6-oxides, in particular 6-(2,4,6-trimethylbenzoyl)-(6H)-dibenz[c,e][1,2]-oxaphosphorine 6-oxide, described in the earlier German Patent Application 3,728,168 refiled as German Patent Application P 38 27 735.2. The photoinitiators can also be used in combination with one another or with coinitiators or activators, for example with Michlers ketone and its derivatives or 2-alkylanthraquinones. The amount of photoinitiator is in general about 0.01 to 10%, preferably about 0.5 to 5% by weight of the recording material.

Frequently it is of advantage also to add further auxiliaries and additives to the recording material, for example thermal polymerization inhibitors, such as hydroquinone and its derivatives, 2,6-di-tert.-butyl-p-cresol, nitrophenols, nitrosamines such as N-nitrosodiphenylamine or salts of N-nitrosocyclohexylhydroxylamine, for example the alkali metal or aluminum salts thereof. Further customary additives are dyes, pigments, processing auxiliaries and plasticizers.

For the production of relief and flexographic printing plates, the mixtures according to the invention can be shaped by casting from solution or extruding and calendaring to layers from about 0.02 to 6 mm thick, preferably from 0.2 to 2 mm thick. The layer can be laminated onto the surface of a suitable support, or a solution of the mixtures according to the invention can be applied to a coating support.

As well as for the production of relief printing plates, the mixtures according to the invention can also be used, for example, for the production of planographic printing plates, photogravure cylinders, screen printing stencils and photoresists.

Suitable supports, depending on the intended use, include polyester films, steel or aluminum sheets, copper cylinders, screen printing stencil supports, foam layers, rubber-elastic supports or circuit boards. It can also be advantageous to apply a cover or protective coating, for example a thin coating of polyvinyl alcohol, or a strippable cover film, for example of polyethylene glycol terephthalate, to the photosensitive recording layer. Furthermore, a pre-coating of the support can be advantageous. The additional coating between the support and the photosensitive layer can act, for example, as an antihalo protective layer or as an adhesive layer.

The recording materials according to the invention can be exposed image-wise using actinic light from light sources such as mercury vapor lamps or fluorescent tubes, the wavelength emitted preferably being between about 300 and 420 nm. The removal of the non-exposed and non-cross-linked portions of the layer can be effected by spraying, washing or brushing with water or aqueous solutions, for example of wetting agents or emulsifiers. Furthermore, small amounts of anti-foaming agents or water-miscible organic solvents, for example lower aliphatic alcohols, can be added to the solution. The proportion of organic solvents is in general less than about 10%, preferably less than 5%. Appropriately, the developed relief forms are dried at temperatures of up to about 120° C. and optionally postexposed, at the same time or thereafter, using actinic light.

The recording materials according to the invention are particularly suitable for the production of printing forms, in particular letter press printing or relief printing forms, which are particularly suitable for flexographic printing.

The invention is illustrated by the following Examples. The limiting viscosity numbers $J_o$ were determined at 25° C. in an Ostwald viscometer. The degrees of hydrolysis (in mol %) relate to the hydrolyzable monomer units in the unsaponified graft polymer.

Preparation of Graft Polymers

Preparation Example 1

Synthesis of the polyurethane graft base: 3,000 g of polyethylene glycol 600 and 193.1 g of 1,4-butanediol are warmed together with 1.5 ml of 1,4-dimethylpiperazine to 75° C. and 1428.2 g of isophorone diisocyanate are added in the course of 6 hours. The mixture is then allowed to react for a further two hours at 80° C. $J_o$ of the polyurethane prepared in this way is 10.6 ml/g in methanol.

Synthesis of the Graft Polymer 1,500 g of the polyurethane graft base are warmed to 80° C. and a mixture of 3,480 g of vinyl acetate and 26.1 g of dibenzoyl peroxide (75%) is added in the course of 5 hours, with stirring. After a further reaction time of 45 minutes at 80° C., unconverted vinyl acetate is removed by azeotropic distillation with methanol. $J_o$ of the graft polymer prepared in this way is 17.5 ml/g in THF.

Saponification of the graft polymer: 117.3 g of 10% methanolic NaOH are added at room temperature to 3,476.7 g of a 50% methanolic solution of the graft polymer. The mixture gels after some time and is granulated. After two hours the resulting granules are slurried in methanol and an amount of acetic acid equivalent to the NaOH is added. The product is filtered off, washed several times with methanol and dried: $J_o$ is 11.8 ml/g in water and the degree of hydrolysis is 91.1%.

Preparation Example 2

The preparation is carried out as in Example 1 except that in addition 117.3 g of water are added during the saponification. $J_o$ of the product thus obtained is 15.1 ml/g in water and the degree of hydrolysis is 97.8%.

Preparation Example 3

The preparation is carried out as in Preparation Example 1, except that 172.1 g of 10% methanolic NaOH and 172.1 g of water are added during the saponification of 9,178 g of a 50% methanolic solution of the graft polymer at room temperature. $J_o$ is 10.1 ml/g in water and the degree of hydrolysis is 85.8%.

Use Example 1

57.8 parts by weight of the graft polymer prepared in accordance with Preparation Example 1, 35.8 parts by weight of diethylene glycol monoacrylate, 4.0 parts by weight of trimethylolpropane triacrylate, 2.0 parts by weight of benzil dimethylketal and 0.8 part by weight of 2,6-di-tert.-butyl-4-methylphenol are homogenized in a kneader at 155° C. to give a transparent melt and the melt is then pressed hot in a plate press between a 0.125 mm thick polyester film and a 0.3 mm thick anodically oxidized aluminum sheet, which has been provided with a polyurethane adhesive layer, at 155° C. for two minutes to give a 0.8 mm thick layer. After stripping off the polyester film, the layer is exposed for five minutes image-wise using a UVA flat exposure apparatus and developed for three minutes with water at 40° C. After drying, a relief printing plate with a Shore A hardness of 91 is obtained.

Use Example 2

Analogously to Use Example 1, 145 parts by weight of a graft polymer prepared in accordance with Preparation Example 2, 90 parts by weight of 2-hydroxyethyl methacrylate, 10 parts by weight of trimethylolpropane triacrylate, 5 parts by weight of benzil dimethylketal and 2 parts by weight of 2,6-di-tert.-butyl-4-methylphenol are homogenized at 180° C. and processed to give a relief printing plate with a Shore A hardness of 92.

Use Example 3

In a counter-running twin-screw extruder with 6 heating zones (screw diameter D = 34 mm, screw length 23 D) the graft polymer described in Preparation Example 2 is metered in at a rotational speed of 90 rev/min. at a rate of 3 kg/h and melted up to the second heating zone at 180° C. A solution consisting of 85% 2-hydroxyethyl methacrylate, 9.4% trimethylolpropane triacrylate, 4.7% benzil dimethylketal and 0.9% 2,6-di-tert.-butyl-4-methylphenol is then mixed in, at a rate of 2.2 kg/h, using a reciprocating pump and the whole is homogenized at 170° C. up to the sixth heating zone. The melt is applied through a broad-slit nozzle to 0.3 mm thick anodically oxidized aluminum sheet, which has been provided with a polyurethane adhesive coating. After covering the sheet-like preformed photopolymer mass with a 0.125 mm thick polyester film, the multi-layer element is hot-pressed at 180° C. so that the thickness of the photosensitive layer is 1 mm. After stripping off the polyester film, the layer is exposed for 5 minutes image-wise using a UVA flat exposure device and developed for 3 minutes with water at 40° C. After drying, a relief printing plate with a Shore A hardness of 91 is obtained.

Use Example 4

The graft polymer described in Preparation Example 3 is metered into the twin-screw extruder described in Use Example 3 and melted at 150° C. up to the end of the second heating zone. A solution consisting of 85% diethylene glycol monomethacrylate, 9.4% trimethylolpropane tri-acrylate, 4.7% benzil dimethylketal and 0.9% 2,6-di-tert.-butyl-4-methylphenol is then mixed in at a rate of 2.2 kg/h using a reciprocating pump and the mixture is homogenized at 130° C. up to the sixth heating zone. The melt is applied through a broadslit nozzle to 0.3 mm thick anodically oxidized aluminum sheet which has been provided with a polyurethane adhesive coating. After covering the sheet-like pre-formed photopolymer mass with a 0.125 mm thick polyester film, the multi-layer element is hot-pressed at 120° C. so that the thickness of the photosensitive layer is 1 mm. After stripping off the polyester film, the layer is exposed for 5 minutes image-wise using a UVA flat exposure device and developed for 3 minutes with water which is at a temperature of 40° C. After drying, a relief printing plate with a Shore A hardness of 74 is obtained.

Use Example 5

A coating solution is prepared from

| | | |
|---|---|---|
| 1.0 | part by weight | of the graft polymer described in Preparation Example 1, |
| 1.0 | part by weight | of a reaction product obtained from 1 mol of 2, 4, 4-trimethyl-hexamethylenediisocyante and 2 mols of hydroxyethyl-methacrylate, |
| 0.02 | part by weight | of 2,4-bis-trichloromethyl-6-(4-styrylphenyl)-s-triazine, |
| 0.02 | part by weight | of an azo dye obtained from 2,4-dinitro-6-chloro-benzene-diazonium salt and 2-methoxy-5-acetylamino-N-cyanoethyl-N-hydroxyethylaniline in |
| 50.0 | parts by weight | of ethylene glycol monomethyl ether and |
| 2.0 | parts by weight | of water | and is applied to an 0.3 mm thick aluminum foil which has been electrochemically grained in nitric acid, anodized in sulfuric acid and post-treated with an 0.1% strength aqueous solution of polyvinylphosphonic acid, in such a way that a dry layer weight of 1.1 g/m$^2$ is obtained.

The plate is then coated with a 3.5% strength aqueous solution of polyvinyl alcohol (12% residual acetyl groups, K-value 4). After drying, a covering layer having a weight of 0.8 g/m$^2$ is obtained. The resulting printing plate is exposed for 100 seconds to the light of a 5 kW metal halide lamp arranged at a distance of 110 cm, under a 13-step exposure wedge having density increments of 0.15 and onto which a silver film of uniform blackening (density 1.57) and uniform absorption through the effective spectral range has additionally been mounted as a grey filter.

Following exposure, the plate is developed using a developer of the following composition:

| | | |
|---|---|---|
| 5.0 parts by weight | of sodium octyl sulfate, | |
| 1.5 parts by weight | of sodium metasilicate × 5 water, | |
| 1.0 part by weight | of trisodium hydrogen sulfate × 12 water in | |
| 92.0 parts by weight | of distilled water. | |

After wetting by the developer liquid, the non-exposed layer areas are removed within a short period. The plate is then rinsed with water and dried. Step 3 is completely reproduced in the copy and even extremely fine screens and lines of the original are clearly rendered.

What is claimed is:

1. A photocurable elastomeric mixture consisting essentially of:
   a) an elastomeric graft polymer binder which comprises
      i) a graft base, consisting essentially of a polyurethane having at least 2 urethane groups formed by reaction between a diol and a diisocyanate, and
      ii) a plurality of components comprising carboxylic acid vinyl ester units having 3 to 20 carbon atoms, or saponification products thereof, grafted to said graft base,
      said graft polymer being soluble or dispersible in water or aqueous solution,
   (b) a compound comprising at least one terminal ethylenically unsaturated group and having a boiling point at normal pressure of above 100° C., which is polymerizable by free radical polymerization, and
   (c) a compound or combination of compounds capable of initiating polymerization of compound b) under the action of actinic radiation.

2. A photocurable mixture as claimed in claim 1, wherein said grafted-on components further comprise units of ethylenically unsaturated monomers other than carboxylic acid vinyl esters, or saponification products thereof.

3. A photocurable mixture as claimed in claim 1, wherein said graft polymer comprises about 10 to 99% by weight of grafted-on constituent.

4. A photocurable mixture as claimed in claim 1, wherein said diisocyanate is an aliphatic or cycloaliphatic diisocyanate.

5. A photocurable mixture as claimed in claim 1, wherein said diol is an aliphatic or cycloaliphatic diol or mixture thereof, or a polyetherdiol.

6. A photocurable mixture as claimed in claim 5, wherein said diol is a mixture of a polyetherdiol and a monomeric diol.

7. A photocurable mixture as claimed in claim 6, wherein about 0.1 to 0.7 mol of monomeric diol are employed per mol of polyetherdiol.

8. A photocurable mixture as claimed in claim 1, wherein the molar ratio of diol units to diisocyanate units is about 1:0.9 to 1:0.5.

9. A photocurable mixture as claimed in claim 1, wherein said carboxylic acid vinyl ester units have 4 to 14 carbon atoms.

10. A photocurable mixture as claimed in claim wherein said graft polymer has been saponified to the extent of about 70 to 99 mol %, based on the number of saponifiable monomer units.

11. A photocurable mixture as claimed in claim 1, wherein compound (b) is an acrylic acid ester or methacrylic acid ester of a monohydric or polyhydric alcohol or an acrylamide or methacrylamide.

12. A photocurable mixture as claimed in claim 1, which comprises about 20 to 95% by weight of graft polymer (a), about 5 to 70% by weight of polymerizable compound (b) and about 0.01 to 10% by weight of photopolymerization initiator (c).

13. A photocurable recording material comprising a support and a photocurable layer comprising a mixture as claimed in claim 1.

14. A photocurable recording material as claimed in claim 13, further comprising an adhesive layer between said support and said photocurable layer.

* * * * *